United States Patent
Stumber

(10) Patent No.: US 11,873,216 B2
(45) Date of Patent: Jan. 16, 2024

(54) METHOD FOR PRODUCING DAMPER STRUCTURES ON A MICROMECHANICAL WAFER

(71) Applicant: Robert Bosch GmbH, Stuttgart (DE)

(72) Inventor: Michael Stumber, Korntal-Muenchingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 385 days.

(21) Appl. No.: 17/421,912

(22) PCT Filed: Apr. 9, 2020

(86) PCT No.: PCT/EP2020/060124
§ 371 (c)(1),
(2) Date: Jul. 9, 2021

(87) PCT Pub. No.: WO2020/216629
PCT Pub. Date: Oct. 29, 2020

(65) Prior Publication Data
US 2022/0024757 A1    Jan. 27, 2022

(30) Foreign Application Priority Data
Apr. 23, 2019  (DE) .......................... 102019205799.3

(51) Int. Cl.
*B81C 1/00* (2006.01)
*B81B 7/00* (2006.01)

(52) U.S. Cl.
CPC ........ *B81C 1/00825* (2013.01); *B81B 7/0016* (2013.01); *B81C 2203/032* (2013.01)

(58) Field of Classification Search
CPC .............. B81C 1/00825; B81C 1/0046; B81C 2201/0152; H01L 21/566; B81B 7/0016
See application file for complete search history.

(56) References Cited

U.S. PATENT DOCUMENTS

| | | | |
|---|---|---|---|
| 2016/0368176 A1* | 12/2016 | Kasai | B32B 7/06 |
| 2021/0179422 A1* | 6/2021 | Hoefer | B81B 7/02 |
| 2021/0323810 A1* | 10/2021 | Stumber | B81B 7/0016 |

FOREIGN PATENT DOCUMENTS

| | | |
|---|---|---|
| DE | 102018222685 A1 | 6/2020 |
| JP | 2000280385 A | 10/2000 |

(Continued)

OTHER PUBLICATIONS

International Search Report for PCT/EP2020/060124 dated Jul. 28, 2020.

*Primary Examiner* — Shahed Ahmed
*Assistant Examiner* — Sun Mi Kim King
(74) *Attorney, Agent, or Firm* — NORTON ROSE FULBRIGHT US LLP

(57) ABSTRACT

A method for producing damper structures on a micromechanical wafer. The method includes: (A) providing an edge adhesive film and a molding wafer, which includes a first side having a molding structure; (B) applying the edge adhesive film to the first side of the molding wafer at a low atmospheric pressure; (C) joining the edge adhesive film to the first side of the molding wafer by increasing the atmospheric pressure; (D) filling the molding structures with an adhesive; (E) curing the adhesive to form damper structures; (F) bonding the damper structures to a second side of a micromechanical wafer.

6 Claims, 5 Drawing Sheets

(56) References Cited

FOREIGN PATENT DOCUMENTS

| | | |
|---|---|---|
| JP | 2017065269 A | 4/2017 |
| WO | 2012002446 A1 | 1/2012 |
| WO | 2018172081 A1 | 9/2018 |

* cited by examiner

METHOD FOR PRODUCING DAMPER STRUCTURES ON A MICROMECHANICAL WAFER

FIELD

The present invention relates to a method for producing damper structures on a micromechanical wafer.

BACKGROUND INFORMATION

Depending on the mounting location and requirements, some MEMS sensors (e.g., yaw rate sensors) must be supported in a manner allowing vibrations to be damped (for example, operating dynamics sensors in the engine compartment). In this case, various, complicated design approaches are already in use, some of which cushion the entire board or even the sensor module in its outer packaging. Alternatively, it is possible to damp a micromechanical component on the Si chip level by positioning it onto a silicone structure. This is additionally intended to reduce the mechanical stress in response to temperature fluctuations.

In the design approaches up to this point, the assembly, which requires repeated adhesive bonding and highly exact positioning, has been challenging, that is, complex and expensive. Production of the damper structures on the wafer level and connection of them to the sensor wafer, as well as subsequent, joint separation, allows simpler and more exact positioning and requires fewer working steps.

A method for manufacturing a micromechanical device having a damper structure is described in German Patent Application No. DE 102018222685.7; the damper structure being produced on the wafer level on a micromechanical wafer.

In addition, transfer films for transferring thin layers are conventional in semiconductor technology.

SUMMARY

An object of the present invention is to provide an alternative method for producing damper structures on a micromechanical wafer, which is simpler and also more cost-effective as possible than design approaches in the related art.

The present invention relates to a method for producing damper structures on a micromechanical wafer. In accordance with an example embodiment of the present invention, the method includes:

(A) Providing an edge adhesive film and a molding wafer, which includes a first side having a molding structure.

(B) Applying the edge adhesive film to the first side of the molding wafer at a low atmospheric pressure.

(C) Joining the edge adhesive film to the first side of the molding wafer by increasing the atmospheric pressure.

(D) Filling the molding structures with an adhesive.

(E) Curing the adhesive to form damper structures.

(F) Bonding the damper structures to a second side of a micromechanical wafer.

Using the method of the example embodiment of the present invention, directly molded damper structures may advantageously be formed on the wafer level from the described layer system and positioned accurately on the micromechanical wafer. An advantage of this is that the precise and complex step of positioning and assembly between damper and sensor does not have to be carried out individually for each sensor-damper pair, but for several thousand sensors all at once. In this case, conventional positioning methods from lithography may also be used for wafer-to-mask alignment, using alignment structures for optical alignment. A more exact and repeatable alignment of damper to sensor also allows the design and construction of precisely matching damper structures and, consequently, allows damping characteristics geared exactly to the requirements. In addition, the steps for applying the damper structures may be advantageously adjusted and combined with the backthinning (grinding, polishing) of the wafer stack and the later sectioning of the sensor-damper combination (for example, by sawing or laser cutting).

Further advantageous embodiments of the present invention can be gathered from the disclosure herein.

DETAILED DESCRIPTION OF EXAMPLE EMBODIMENTS

Figure 1:
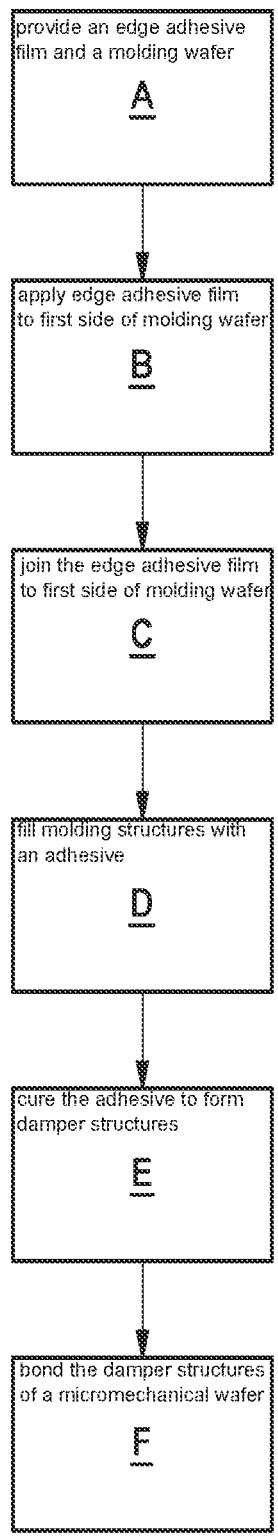
FIG. 1 schematically shows a method of an example embodiment of the present invention for producing damper structures on a micromechanical wafer.

FIG. 1 schematically shows a method of an example embodiment of the present invention for producing damper structures on a micromechanical wafer. The method includes the follow steps:

(A) Providing an Edge Adhesive Film and a Molding Wafer, which Includes a First Side Having a Molding Structure.

An edge adhesive film (edge glue tape, EGT), preferably, stretched onto a frame or support, is made available for application to the first side of a molding wafer. The molding wafer is also provided with a first side having a molding structure. In this connection, the molding wafer may be a semiconductor wafer, in particular, a conventional silicon wafer. However, the molding wafer may also be a patterned glass substrate, in particular, a glass substrate, which is transparent to UV radiation and is made of, for example, borosilicate. The molding structure is mainly a complementary structure or a negative for the damper structures to be produced. The edge adhesive film and the molding wafer are made available in a process chamber, in particular, a vacuum chamber.

(B) Applying the Edge Adhesive Film to the First Side of the Molding Wafer at a Low Atmospheric Pressure.

The process chamber is evacuated. The edge adhesive film is subsequently applied to the first side of the molding wafer.

(C) Joining the Edge Adhesive Film to the First Side of the Forming Wafer by Increasing the Atmospheric Pressure.

The atmospheric pressure in the process chamber is increased again. If the air (or the gas) flows into the vacuum chamber again, then the edge adhesive film positions itself tightly on the molding wafer and, in particular, on the molding structure. Optionally, the edge adhesive film may also be heated, through which the molding structure is transferred to the film even more effectively. Thus, heat may be supplied, in order to support the joining of the film and the surrounding of the molding structures on the first side.

(D) Filling the Molding Structures with an Adhesive.

The adhesive is used for filling in the molding structures. It essentially forms the future damper structures. In addition, the adhesive is intended to adhere effectively to the second side of the micromechanical wafer. For example, resins, in particular, resin cured by UV radiation, are suitable as an adhesive. Alternatively, liquid silicone rubber (LSR), in particular, LSR cured by UV radiation, is suitable. Advantages of LSR include effective damping characteristics and effective temperature stability.

(E) Curing the Adhesive to Form Damper Structures.

In this step, adhesive cured by UV radiation is cured, preferably, through the molding wafer, with the aid of ultraviolet light. Adhesive activated by UV radiation is irradiated prior to the curing. The curing of the adhesive may be assisted by heat.

(F) Bonding the Damper Structures to a Second Side of an [SM(1] Micromechanical Wafer.

The micromechanical wafer is a wafer having surface micromechanical structures on a front side, and having an opposite back side, normally, the substrate. The damper structures may be bonded to the back side of the micromechanical wafer. On its front side, the micromechanical wafer may be capped by a cap wafer. In this case, the damper structures may also be bonded to an outer side of the cap wafer. Thus, the second side of the micromechanical wafer may be the back side or the outer side of the cap.

In a first exemplary embodiment of the method according to the present invention, in step (D), a film, for example, made of polyethylene terephthalate (PET film), is initially provided on a level substrate, and subsequently, the adhesive is applied to the PET film. The film is preferably DAF (die attach film) tape. Other single-layer or multilayered films made of plastic or also other suitable materials may be used likewise. After that, the adhesive is cured in step (E). This is preferably carried out, using UV illumination of the adhesive through the substrate and the PET film. Subsequently, the substrate is removed. The damper structures are removed from the molding wafer, and in step (F), they are bonded to the second side of the micromechanical wafer. The damper structures may optionally be bonded to the second side of the micromechanical wafer with or without the PET film or also the edge adhesive film.

Alternatively, the damper structures may initially be bonded to the second side of the micromechanical wafer, and subsequently, the molding wafer may be removed.

In a second exemplary embodiment of the method according to the present invention, the micromechanical wafer is already provided in step (D). The adhesive is applied to the second side of the micromechanical wafer or to the first side of the molding wafer (indirectly with the aid of the edge adhesive film).

Subsequently, the first side of the molding wafer and the second side of the micromechanical wafer are pressed together with the adhesive between them. The curing of the adhesive in step (E) and the bonding of the damper structures to the second side of a micromechanical wafer in step (F) then take place in one production step. UV-activated adhesive, which is illuminated with UV radiation prior to the pressing-together, is preferably used. Alternatively, or in addition, the adhesive is thermally cured. Alternatively, adhesive cured by UV radiation is used. The UV illumination may take place through the molding wafer, if this wafer is transparent to UV radiation. For example, a glass wafer made of borosilicate may be used for this.

After the adhesive cures, the molding wafer is detached from the damping structures.

As an option, the edge adhesive film may additionally be removed from the damper structures.

Figure 2:
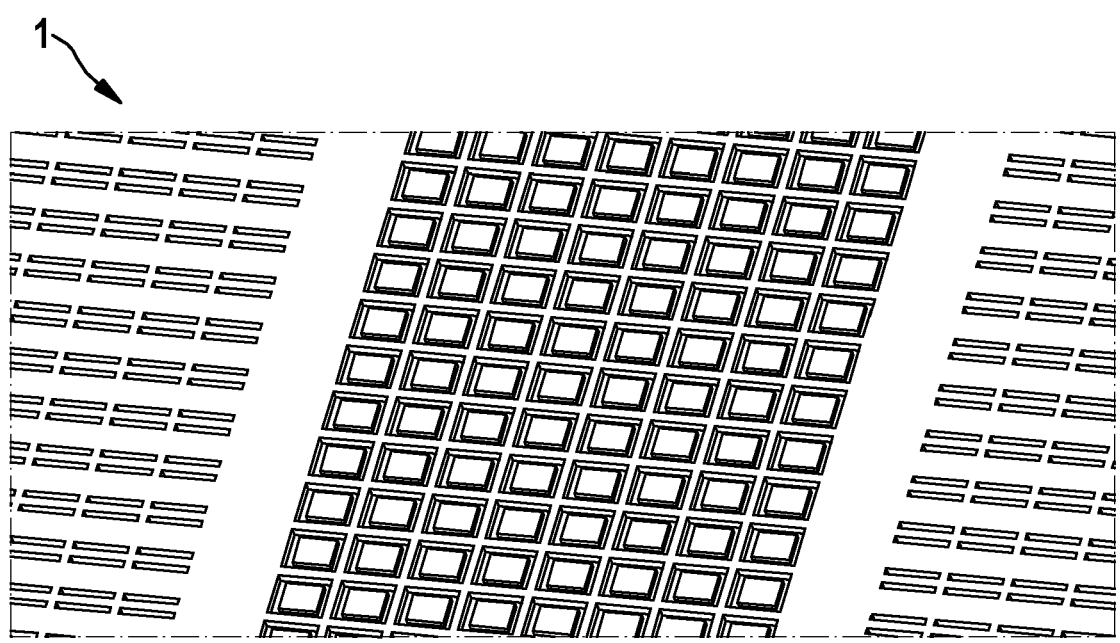
FIG. 2 shows an example of a molding wafer having regions of different molding structures.

FIG. 2 shows an example of a molding wafer having regions of different molding structures, as is provided in method step (A).

Figure 3A:
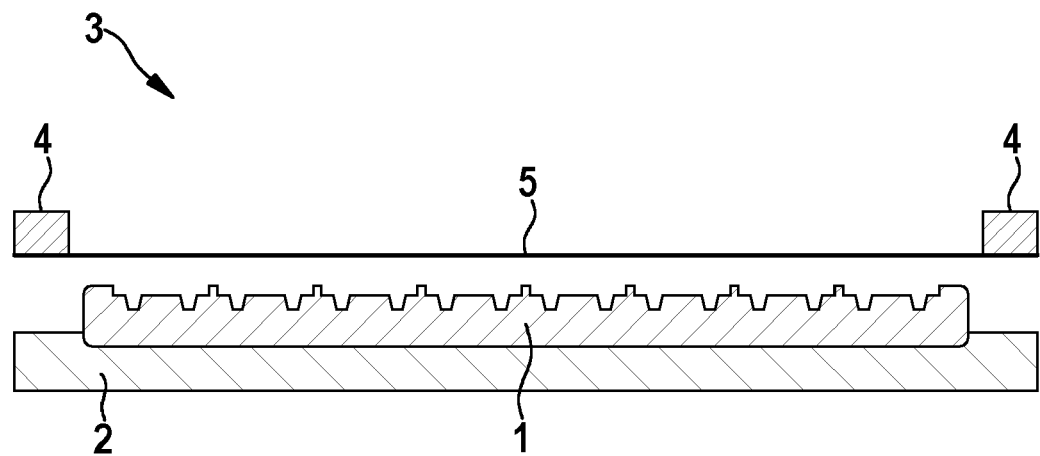
FIGS. 3a and 3b schematically show the steps (B) and (C) in an exemplary embodiment of the method according to the present invention.

FIGS. 3a and b schematically show the steps (B) and (C) in an exemplary embodiment of the method according to the present invention.

Molding wafer 1 lies positioned on a heating plate 2 in a vacuum chamber 3 (FIG. 3a).

After the application of low pressure, in particular, a vacuum of <1 mbar, the edge adhesive film 5 stretched onto a frame 4 is applied to or also pressed onto molding wafer 1 and heated.

Figure 3B:
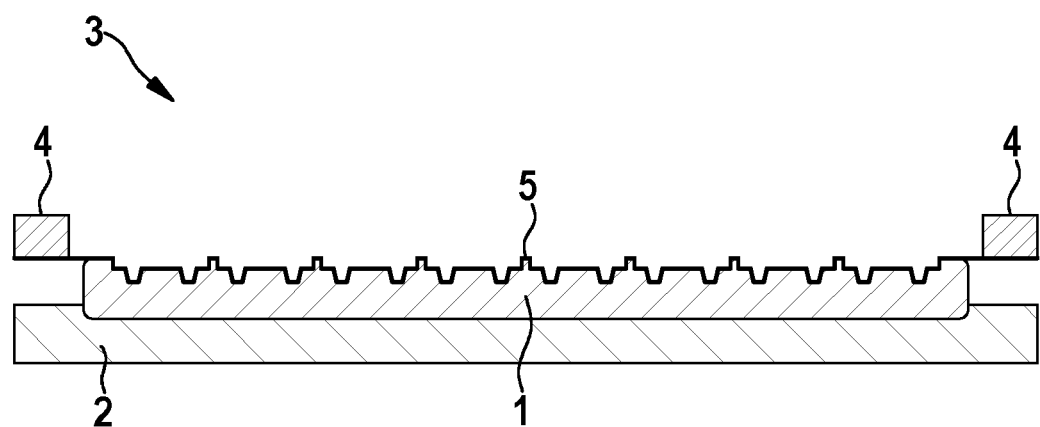

If the atmospheric pressure is increased in the vacuum chamber, then the edge adhesive film conforms to the molding structures and stiffens in response to reducing the temperature again (FIG. 3b).

Figure 4A:
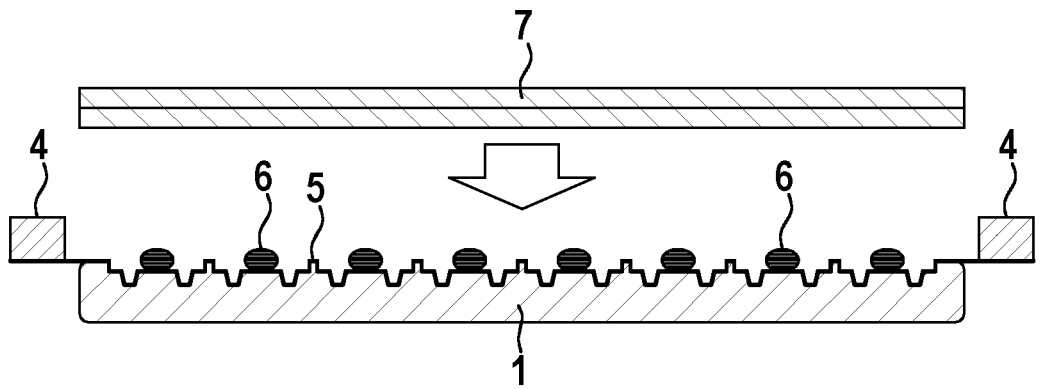
FIGS. 4a, 4b and 4c schematically show the steps (D), (E) and (F) in an exemplary embodiment of the method according to the present invention.
Figure 4B:
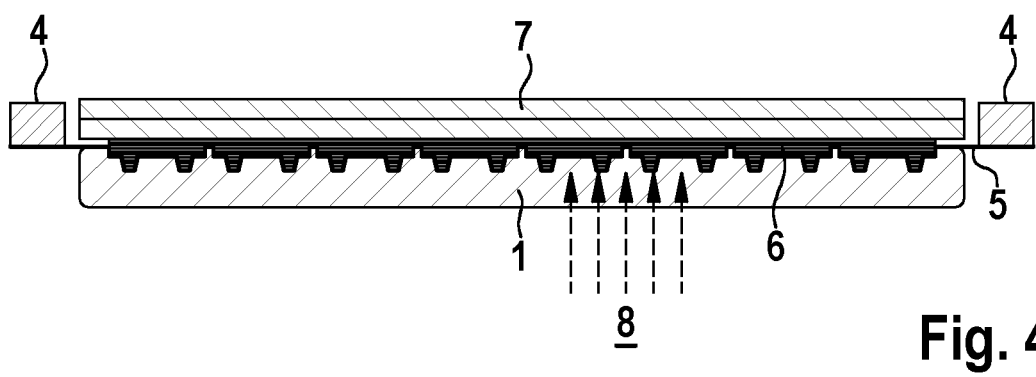
Figure 4C:
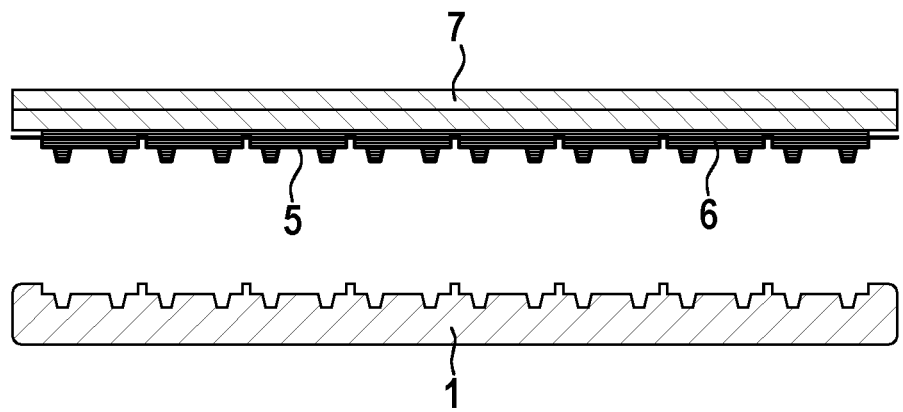

FIGS. 4a, 4b and 4c schematically show the steps (D), (E) and (F) in an exemplary embodiment of the method according to the present invention.

Molding wafer 1 lies with edge adhesive film 5 pointing upwards. The molding structures are filled in with adhesive 6 from above. This may be accomplished by exact dispensing into individual structures, or by centrally applying a measured amount. Now, micromechanical wafer 7, for example, a capped sensor wafer, is aligned and pressed on from above (FIG. 4a).

Adhesive 6 fills the spaces in molding wafer 1 and forms the damper structures. The adhesive or the LSR is cured by UV irradiation 8, for example, from the lower side, or by heat, and bonds with the micromechanical wafer (FIG. 4b).

In the end, edge adhesive film 5 is separated from molding wafer 1, and what is obtained, is the micromechanical wafer 7 joined to the damper structures made of adhesive or LSR 6, and to edge adhesive film 5 (FIG. 4c).

FIGS. 5a, 5b, 5c and 5d schematically show the steps (D), (E) and (F) in a further exemplary embodiment of the method according to the present invention.

Figure 5A:
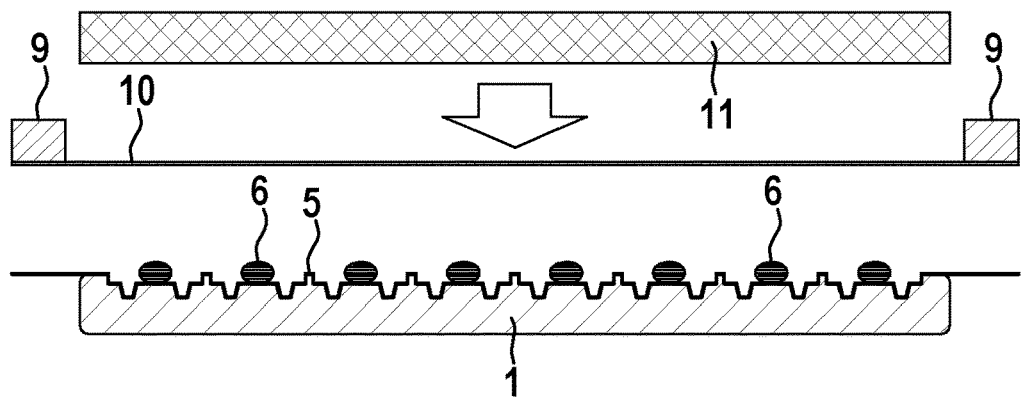
FIGS. 5a, 5b, 5c and 5d schematically show the steps (D), (E) and (F) in a further exemplary embodiment of the method according to the present invention.

Molding wafer 1 lies with edge adhesive film 5 up. The molding structures are filled in with adhesive 6. This may be accomplished by exact dispensing into individual structures, or by centrally applying a measured amount. Now, a DAF (die attach film) tape 10 stretched out by a further frame 9 is pressed on from above, using a stamp 11 (FIG. 5a).

Figure 5B:
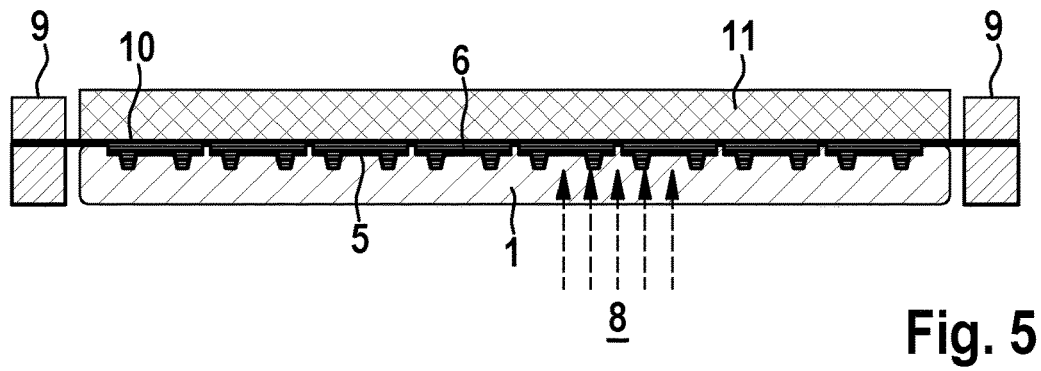

Adhesive 6 fills the spaces in molding wafer 1 between edge adhesive film 5 and DAF tape 10 and forms the damper structures together with the films. The adhesive (or the LSR) 6 is cured by UV irradiation 8, for example, from the lower side, or by heat, and bonds to edge adhesive film 5 and DAF tape 10 (FIG. 5b).

After the curing, stamp 11 moves upwards, and the composite of DAF tape 10, adhesive 6, and edge adhesive film 5 may be removed from molding wafer 1 by further frame 9.

Figure 5C:
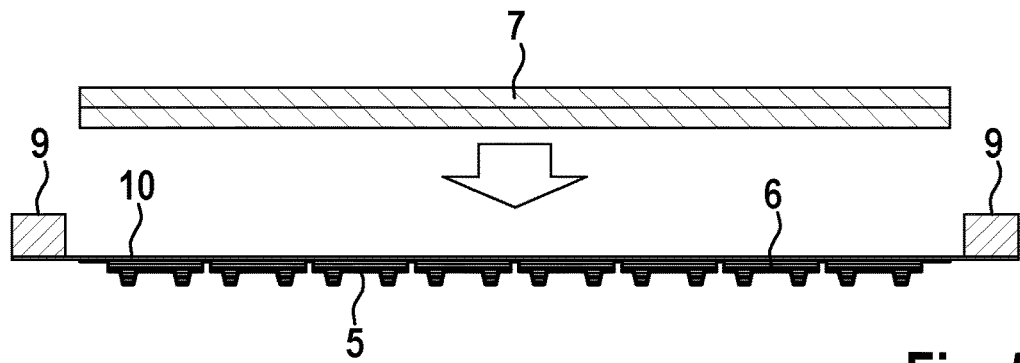

Subsequently, this structure may be aligned with micromechanical wafer 7, and DAF tape 10 is bonded to the micromechanical wafer (FIG. 5c).

Figure 5D:
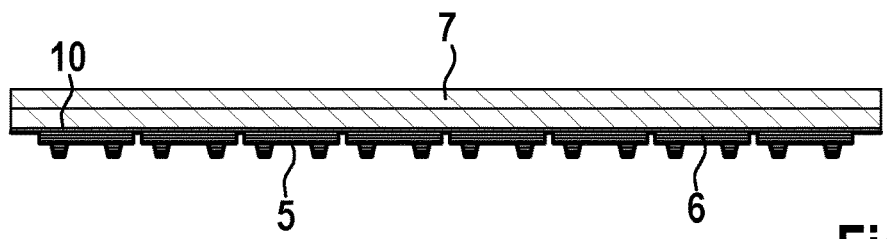

What is obtained, is the micromechanical wafer 7 bonded to the damper structures made of DAF tape 10, adhesive or LSR 6, and edge adhesive film 5 (FIG. 5d).

LIST OF REFERENCE NUMERALS

1 molding wafer
2 heating plate 3 vacuum chamber
4 frame
5 edge adhesive film
6 adhesive
7 micromechanical wafer
8 UV irradiation
9 further frame
10 DAF tape
11 stamp

What is claimed is:

1. A method for producing damper structures on a micromechanical wafer, comprising the following steps:
    (A) providing an edge adhesive film, and a molding wafer which includes a first side having a molding structure;
    (B) applying the edge adhesive film to the first side of the molding wafer at a low atmospheric pressure;
    (C) joining the edge adhesive film to the first side of the forming wafer by increasing the atmospheric pressure;
    (D) filling the molding structure with an adhesive;
    (E) curing the adhesive to form damper structures; and
    (F) bonding the damper structures to a second side of a micromechanical wafer.

2. The method for producing damper structures as recited in claim 1, wherein in step (C), the edge adhesive film is heated.

3. The method for producing damper structures as recited in claim 1, wherein:
    in step (D), a film is initially provided, and subsequently, the adhesive is applied to the film or to the edge adhesive film, and after that, the film is pressed onto the first side of the molding wafer by a stamp; and
    after step (E), the substrate is removed.

4. The method for producing damper structures as recited in claim 3, wherein after the substrate is removed, the damper structures are detached from the molding wafer, and subsequently, in step (F), the damper structures are bonded to the second side of the micromechanical wafer.

5. The method for producing damper structures as recited in claim 3, wherein after the substrate is removed, then, in step (F), the damper structures are bonded to the second side of the micromechanical wafer, and subsequently, the molding wafer is removed.

6. The method for producing damper structures as recited in claim 1, wherein:
    in step (D), the micromechanical wafer is provided, and the adhesive is applied to the second side of the micromechanical wafer or to the first side of the molding wafer;
    subsequently, the first side of the molding wafer and the second side of the micromechanical wafer are pressed together with the adhesive between them; and
    subsequently, the curing of the adhesive in step (E) and the bonding of the damper structures to the second side of a micromechanical wafer in step (F) takes place in one joint production step.

* * * * *